United States Patent
Gudovich et al.

(10) Patent No.: US 9,923,259 B2
(45) Date of Patent: Mar. 20, 2018

(54) DEVICE FOR RADIO-FREQUENCY POWER COUPLING AND METHOD OF USING THE DEVICE

(71) Applicant: Siemens LLC, Moscow (RU)

(72) Inventors: Alexey Gudovich, Moscow (RU); Andrey Krasnov, Moscow (RU); Konstantin Nikolskiy, Ivanteevka (RU); Alexander Smirnov, Moscow (RU)

(73) Assignee: OOO SIEMENS, Moscow (RU)

( * ) Notice: Subject to any disclaimer, the term of this patent is extended or adjusted under 35 U.S.C. 154(b) by 0 days.

(21) Appl. No.: 14/910,504

(22) PCT Filed: Aug. 15, 2013

(86) PCT No.: PCT/RU2013/000709
§ 371 (c)(1),
(2) Date: Feb. 5, 2016

(87) PCT Pub. No.: WO2015/023204
PCT Pub. Date: Feb. 19, 2015

(65) Prior Publication Data
US 2016/0181683 A1    Jun. 23, 2016

(51) Int. Cl.
*H01P 5/12* (2006.01)
*H03H 7/38* (2006.01)
*H05K 7/20* (2006.01)

(52) U.S. Cl.
CPC .............. *H01P 5/12* (2013.01); *H03H 7/38* (2013.01); *H05K 7/20218* (2013.01)

(58) Field of Classification Search
CPC ..... H01P 5/12; H01P 5/16; H01P 1/30; H05K 7/20218

(Continued)

(56) References Cited

U.S. PATENT DOCUMENTS 4,234,854 A * 11/1980 Schellenberg .......... H03F 3/602
                                                                 330/286
5,142,253 A * 8/1992 Mallavarpu ............... H01P 5/12
                                                                 333/127

(Continued)

FOREIGN PATENT DOCUMENTS

CN    201 904 430 U    7/2011
CN    202 487 735 U    10/2012

(Continued)

OTHER PUBLICATIONS

Office Action dated May 5, 2017 which issued in the corresponding Japanese Patent Application No. 2016-534556.

(Continued)

*Primary Examiner* — Robert J Pascal
*Assistant Examiner* — Kimberly Glenn
(74) *Attorney, Agent, or Firm* — Cozen O'Connor

(57) ABSTRACT

A device and a method for utilizing the device for radio-frequency (RF) power coupling, particularly a power combiner and/or divider, includes a box shaped casing forming the outside conductor, and connectors for inputting and outputting RF-power, which are electrically connected to at least one center conductor, where the electrical connection between the connectors and the at least one center conductor is a direct electrical and mechanical connection.

22 Claims, 4 Drawing Sheets

(58) Field of Classification Search
USPC .......................................................... 333/125
See application file for complete search history.

(56) References Cited

U.S. PATENT DOCUMENTS

| | | | |
|---|---|---|---|
| 5,291,155 A | | 3/1994 | Waterman et al. |
| 2010/0001811 A1* | | 1/2010 | Haunberger .............. H01P 5/12 |
| | | | 333/132 |

FOREIGN PATENT DOCUMENTS

| | | |
|---|---|---|
| CN | 202 651 330 U | 1/2013 |
| CN | 202 721 251 U | 2/2013 |
| CN | 202 797 937 U | 3/2013 |
| DE | 12 76 764 | 9/1968 |
| DE | 1276764 B | 9/1968 |
| JP | 61-212351 | 9/1986 |
| JP | 64-444102 | 2/1989 |
| JP | 01-44102 | 9/1989 |
| JP | 2016-534556 | 11/2016 |
| KR | 2001-0073264 | 8/2001 |
| KR | 101 236 367 B1 | 2/2013 |

OTHER PUBLICATIONS

Office Action (and an English translation) dated May 11, 2017 which issued in the corresponding Korean Patent Application No. 10-2016-7006209.

Office Action dated Sep. 19, 2017 which issued in the corresponding Japanese Patent Application No. 2016-534556.

* cited by examiner

DEVICE FOR RADIO-FREQUENCY POWER COUPLING AND METHOD OF USING THE DEVICE

CROSS-REFERENCE TO RELATED APPLICATIONS

This is a U.S. national stage of application No. PCT/RU2013/000709 filed 15 Aug. 2013.

BACKGROUND OF THE INVENTION

1. Field of the Invention

The present invention relates to a device and a method of using the device for radio-frequency power coupling, particularly a power combiner and/or divider, comprising a box shaped casing as an outside conductor, connectors for input and output of RF-power, which are electrically connected to at least one center conductor.

2. Description of the Related Art

Devices for radio-frequency (RF) power coupling are power dividers and power combiners. Power dividers are used to divide RF power from single RF generators to multiple recipients. Power combiners are used to combine RF power from multiple sources to feed a single recipient with additional power. Recipients receiving RF power are, for example, loads or antennas. Most devices used as power divider or power combiner also work reciprocally, i.e. they can be used both as a divider and as a combiner. In the following, the use of the wording divider includes the use of a combiner and the use of the wording combiner includes the use of a divider. The main parameters for combiner/divider design in terms of RF power handling are heat and breakdown voltage. Requirements in use are the transmission of RF power with low insertion and return loss. Further requirements are compactness, easy assembly and cost effective, easy manufacturing.

There are two main types of conventional power combiners/dividers, e.g., based on printed circuit boards (PCB) or coaxial based combiners/dividers. PCB based combiners/dividers are mainly used in low power applications. Low power in this context is in the range of a couple of kilowatts in continuous wave regime to approximately ten kilowatts in pulsed mode use. PCB based devices are quite compact but are not for use in high power applications. Coaxial based combiners/dividers are usable for low power applications and for extremely high power levels, particularly up to hundreds of kilowatt. A disadvantage of coaxial based combiners/dividers is the lack of compactness, i.e., high volume respectively size.

A conventional combiner, e.g., as described in U.S. Pat. No. 4,459,568, is an air-stripe coupler. Here, power propagates in the gap between two strip lines. The device contains PCB, which does not enable high voltage usage. US 2012/0029327 discloses a conventional power combiner/divider that permits high power signals. This conventional power combiner/divider is relatively large in size and is not compact, and due to its cylindrical shape it cannot be used in racks. There is excessive empty space within the structure of the power combiner/divider.

U.S. Pat. No. 5,111,166 describes an electrical length equalization system for multiple inputs with inter alia power combining applications. Due to its PCB basing, this system can only be used in low power applications. Further, the handling and manufacturing of the system is not easy. The assembly comprises a complicated structure.

Described conventional devices, such as power combiner/divider with a PCB, cannot be used for high power applications due to high losses particularly producing high amounts of waste heat. The heat and high voltage can lead to irreversible damage of the devices. Devices for high power applications are not compact and have high insertion losses, leading to low efficiency.

SUMMARY OF THE INVENTION

In view of the foregoing, it is an object of the present invention to provide a compact device for radio-frequency power coupling, which is easy to manufacture with low costs, and which can be used in high power applications with high efficiency. A further object of the present invention is to provide a method for using the assembly in a compact way. Here, the electrical length from output/input to input/output connectors of the device should be adjustable for high efficiency.

These and other objects and advantages are achieved in accordance with the invention by a device for radio-frequency power coupling, and a method for using a device for radio-frequency (RF) power coupling, where the device for radio-frequency RF power coupling in accordance with the present invention, particularly a power combiner and/or divider, comprises a box shaped casing as outside conductor. Further the device comprises connectors for the input and output of RF-power, which are electrically connected to at least one center conductor. The electrical connection between the connectors and the at least one center conductor is a direct electrical and/or mechanical connection. Direct in this content means without additional electrical or mechanical parts in between.

The construction of the device enables high power applications. The direct electrical connection reduces electrical losses. Low electrical losses are equivalent with low waste heat production. This enables a stable use over time without damage particularly by waste heat. The simple structure of the device, particularly power combiner and/or divider, enables easy assembly and manufacture, with low costs.

The device can comprise at least one power combining or dividing part and at least one impedance transforming part. The impedance transforming part can be a narrow band or wideband frequency element, particularly a RF matching element for reducing the reflection of RF power. This further reduces electrical losses and waste heat.

The impedance transforming part can be an electrical conduction line having an outer stepped, tapered or binomial shape. The shape can be adjusted to applications and the frequency and power in use. The impedance can be optimized for low power losses.

The at least one power combining or dividing part and at least one impedance transforming part can be electrically and mechanically connected directly or via an electrically conducting bridge, particularly in form of a bar. This leads to simple assembly of the device, which is easy to manufacture at low costs.

A recess for equalization of RF electrical length from output or input to input or output connectors can be comprised, particularly within the power combining or dividing part. The recess improves the RF characteristics of the device and can be adjusted to applications, particularly voltage, power and RF range in use.

The box shaped casing can be a parallelepiped, particularly a cuboid, particularly with a substantially dimension of a 19-inch rack and/or with a module front panel wide of 482.6 mm. This enables a compact storage and use in racks, where 19-inch racks are the most common used in electronic applications.

Parts, particularly all parts, can be made of solid metal pieces, particularly comprising or consisting of copper, aluminum and/or steel with copper coating. These materials have good electrical properties, low resistance and high heat transfer properties. A low loss and/or good transfer of waste heat can be assured by using these materials. Additionally, other materials, such as conducting polymers, gold or silver, can be used with low electrical losses. Depending on application, the material can be chosen taking into account RF behavior, electrical losses, heat transfer properties and price.

At least one fluid cooling device can be comprised of, particularly, a water cooling device to transfer heat from the device to the environment. Especially for high power applications, heat transfer can be necessary to enable proper function and/or to prevent damage of the device.

At least one coaxial, and/or one microstrip line, and/or at least one rectangular waveguide, and/or at least one circular waveguide connector can be formed. Particularly, multiple 50 Ohm coaxial connectors at one side and a single 50 Ohm connector at the other side of the device can be formed. These connectors, chosen according to the application and depending from the devices to connect with, provide a good electrical connection in RF applications. Inter alia depending on price, compactness, electrical loss and RF power and frequency the connectors can be chosen.

The at least one center conductor can be in the form of a flat plate, particularly arranged parallel to a ground plane of the box shaped casing as an outside conductor, particularly with isolating spacers in between. This enables a compact, space-saving arrangement and/or use in racks.

It is also an object of the invention to provide a method for using a device for radio-frequency power coupling, particularly the device as described above, where the method comprises the direct electrical and/or mechanical connection of connectors for input and output of RF-power to at least one center conductor, arranged in a box shaped casing, and where the casing serves as an outside conductor.

The method in accordance with the invention enables the use of devices for radio-frequency power coupling with high power, compactly arranged, for example, in a rack, with low losses and/or heat production during use.

For equalization of RF, the electrical length from output/input to input/output connectors can be adjusted by arranging a recess within the at least one center conductor, particularly within a power combining or dividing part of the device. This enables a simple setting with easy adjustment to applications, frequency as well as the power used. This further enables easy design and manufacture, at low costs.

The form, size and/or position of the recess can be chosen in accordance with a predefined electrical length from output/input to input/output connectors.

The method can further comprise the stacking of box shaped devices next and/or on top of each other, particularly in 19-inch racks. This enables a compact assembling with low space consumption in use.

The advantages in connection with the described method of using a device for radio-frequency power coupling in accordance with the present invention are similar to the previously, in connection with the device for radio-frequency power coupling, described advantages and vice versa.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The present invention is further described hereinafter with reference to illustrated embodiments shown in the accompanying drawings, in which.

DETAILED DESCRIPTION OF THE EXEMPLARY EMBODIMENTS

Figure 1:
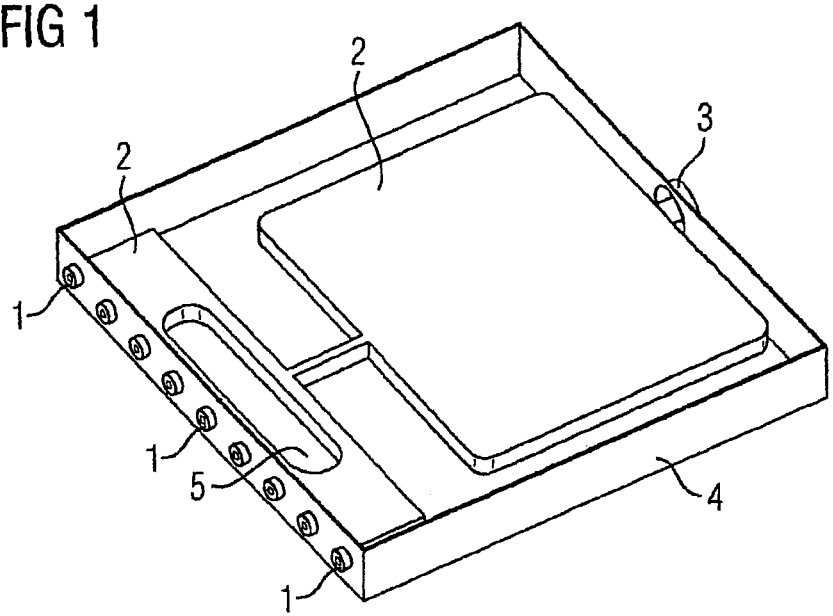
FIG. 1 illustrates a device in accordance with the present invention for radio-frequency RF power coupling in angular view, viewing inner parts thereof.

In FIG. 1 an angular view of a device in accordance with the present invention with its inner parts is shown. The device comprises a power combiner/divider with a flat box shaped casing as outside conductor 4, connectors 1 and 3, and a center conductor 2 with a recess 5.

In use, as a power divider, the connector 3 is electrically connected to a device to receive an input signal. Connectors 1 provide the output signal, for example, to connected devices such as external loads. In use, as a power combiner, the connectors 1 are electrically connected to the input signals and the connector 3 provides the output signal. The signals are in the radio-frequency RF range.

Figure 2:
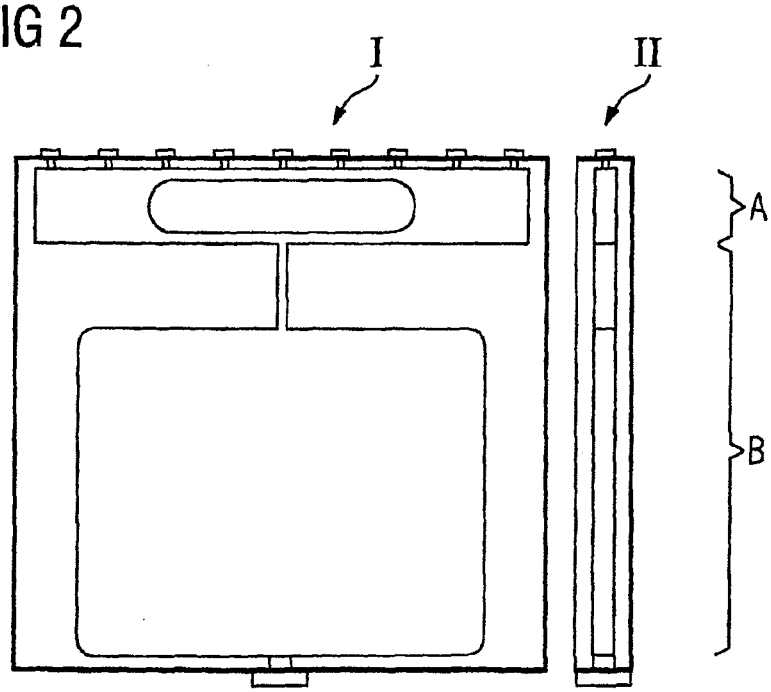
FIG. 2 illustrates a top view I) and a side view II) of the device of FIG. 1 with a power combining or dividing part A and an impedance transforming part B.

As shown in FIG. 2, in top view I) and in side view II) as a cross section along a longitudinal axis of the device, the power combiner/divider consists of a power combining or dividing part A and an impedance transforming part B. Both parts A and B are in form of a flat solid metal plate, for example, such as made of copper, aluminum or copper plated steel. A recess in part A is used for equalization of RF electrical length from output/input to input/output connectors 1, 3. Here, the form and size is predefined by the electrical parameters that the device is required to fulfill.

The impedance transforming part B in form of flat solid metal plate has a rectangular shape, particularly with rounded corners. The impedance transforming part B is electrically and mechanically directly connected with connector 3. On the opposite side of casing 4, an electrical and mechanical connection to the power combining or dividing part A is comprised, particularly in form of a solid metal bridge shaped as a nose to the plate. The power combining or dividing part A in form of a rectangular solid metal plate with recess 5 is directly electrically and mechanically connected to connectors 1, in order to electrically connect to external devices, such as loads.

Figure 3:
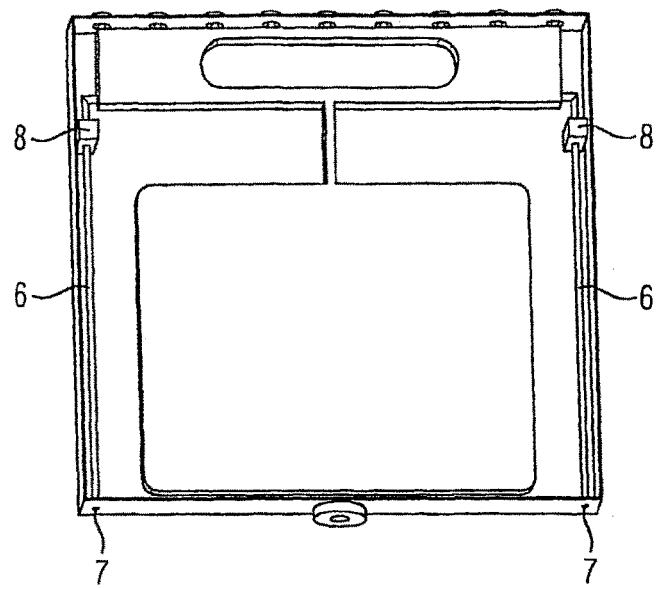
FIG. 3 illustrates a top view of the device of FIG. 1 with an additional cooling device.

As shown in FIG. 3, a fluid cooling device can be comprised within or at the device according to the present invention, particularly a water cooling device. The cooling device or assembly comprises an inlet 7 for the cooling fluid, such as water or air, coming from an external device, such as a pump. The inlet 7 in the box shaped casing 4 is in form of a hole and is fluid sealed connected to a pipe 6 within the casing 4.

The pipe 6 is fixed to the casing 4 with a pipe support 7, in order to mechanically stabilize it within the device. On the opposite side of the pipe 6 to the inlet 7, the pipe 6 is connected to the plate of the power combining or dividing part A with recess 5. Within the plate, fluid channels (not shown) are provided for the cooling fluid. The fluid coming from pipe 6 can flow through the channels and collect heat from the plate. On the opposite side, a second pipe 6, fixed to the casing 4 with the help of a support 8, is provided to transport cooling fluid with waste heat to an outlet 7 in form of a hole in the casing 4. The cooling fluid transfers heat from the power combining or dividing part A to the outside of the device in accordance with the present invention.

FIG. 3 depicts one possible exemplary. Here, the cooling device can comprise additional parts or can have a different structure. For example, supports 8, in order to fix the pipes 6 mechanically to the casing 4, can be at another position so as to not influence RF power within the device. Also, a different number and/or form of supports 8 can be used. The cooling fluid inlets/outlets can be arranged at other positions within the casing 4, so as to not interfere with electrical parts. Different materials for the cooling device parts can be used. For example, plastic material can be used so as to not influence RF power within the device in accordance with the present invention.

Figure 4:
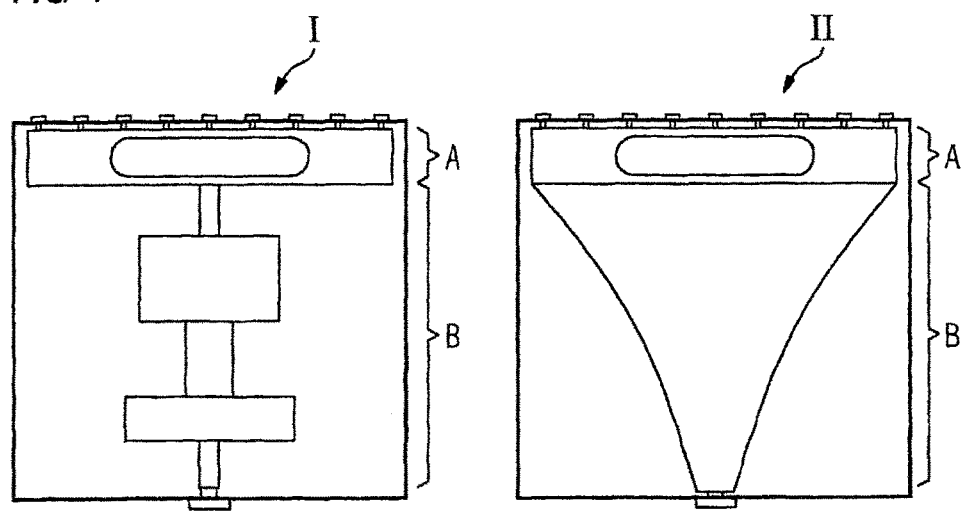
FIG. 4 illustrates a top view of the device of FIG. 1 with an impedance transforming part B with I) stepped and II) tapered form.

As shown in FIG. 4, the impedance transforming part B can have different shapes, depending on the application and power as well as frequency in use of the device in accordance with the present invention. The impedance transforming part B can be a narrow band or a wideband frequency element. It is a RF matching element for reducing the reflection of RF power.

In FIG. 4, two exemplary embodiments are shown. In FIG. 4 I), a stepped shaped impedance transforming part B is shown. In FIG. 4 II), a tapered shaped impedance transforming part B is shown. The impedance transforming part B is in the form of a flat solid plate in both examples, but with the base area having a stepped or tapered form. As shown in the embodiment of FIG. 4 II), the impedance transforming part B can directly merge to the power combining or dividing part A, such as directly connected along one full side of the power combining or dividing part A without a nose in between. Other connections are possibly too, for example, with a power combining or dividing part A and a impedance transforming part B made of one piece.

Figure 5:
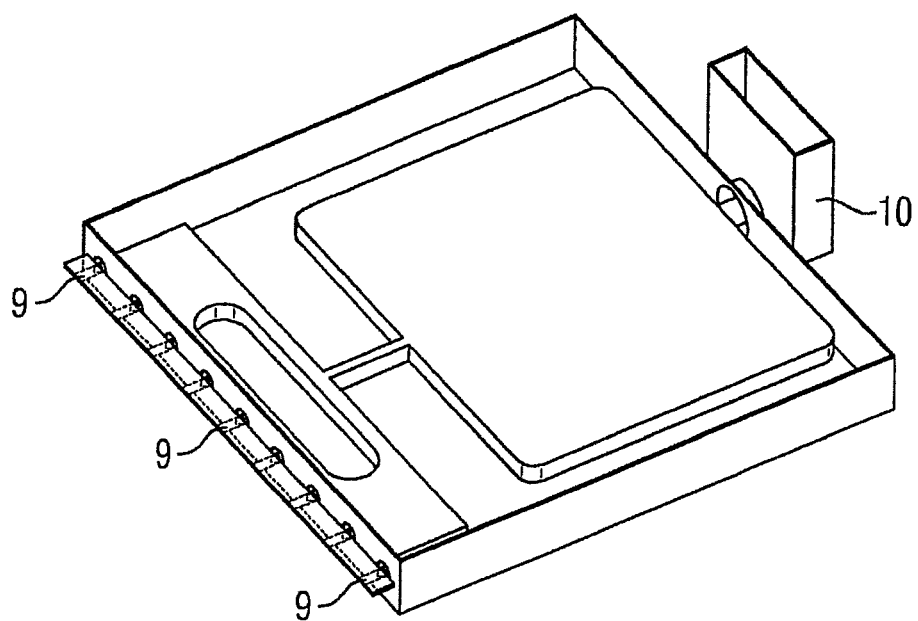
FIG. 5 illustrates the device of FIG. 1 in angular view, with connectors in microstrip line form 9 on one side and rectangular waveguide form 10 on the other side of a casing 4.

Different connectors 1 and 3 can be used. In the embodiment of FIG. 1, coaxial connectors 1 and 3 are used, for input and output of electrical signals. For example, 50 Ohm coaxial connectors can be used. In FIG. 5, an embodiment with a microstrip line 9 as connector 1 and with a rectangular waveguide 10 as connector 3 is shown. Further connectors (not shown), can be used for input and/or output signals, such as circular waveguide connectors. The connectors 1 can be arranged, in the manner shown in FIG. 1, in a row along one side of the casing 4. Other arrangements are possible, depending on the application and number of necessary inputs/outputs as well as the size of the device. For example, parallel rows of connectors 1 next to or above each other or rows, bent lines, stacks and so on particularly at different sides of the casing 4 can be used.

As shown, the flat center conductor 2 is arranged in parallel to the ground plane of the box shaped casing 4. Depending on the form and necessary compactness of the casing 4, other forms of the center conductor 2 can be used. The box shaped casing 4 can be electrically conducting. The outside conductor 4 as well as other parts of the device in accordance with the present invention can be made from a metal sheet, particularly from copper, aluminum or copper plated steel. Outside 4 and inside 2 conductors can be electrically separated inter alia by distance pieces, isolating layers and/or air gaps.

Features described above can be used single or in combination, and in combination with embodiments known from the state of the art. Other materials like metals as gold or silver, semiconductors, or conducting polymers can be used for all elements like connectors for RF-power 1, center conductor 2, connector for RF-power 3 and outside conductor in form of a box shaped casing 4. The elements can be made of the same or different materials.

The box 4 can be of cuboid form, a parallelepiped or other forms like flattened conus. There can be elements (not shown) to fix and arrange parts together. The devices can have an outer shape to be easy arranged in a rack. In electronic applications 19-inch racks are common.

Advantages of the device according to the present invention are inter alia its compactness, high efficiency of RF power transfer with low electrical losses and/or a low waste heat production in use.

Figure 6:
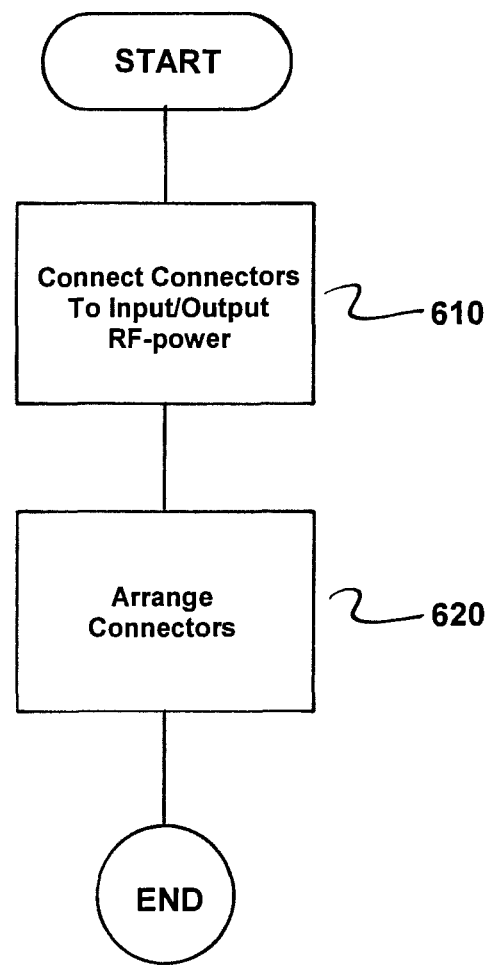
FIG. 6 is a flowchart of the method in accordance with the invention.

FIG. 6 is a flowchart of a method of utilizing a device for radio-frequency (RF) power coupling comprising a box shaped casing forming an outside conductor (4), at least one center conductor (2), connectors (1, 3) for inputting and outputting RF-power, where the connectors are electrically connected to the at least one center conductor (2).

The method comprises connecting the connectors (1, 3) for inputting and outputting the RF-power at least one of directly, electrically and mechanically to the at least one center conductor (2), as indicated in step 610. Next, the connectors are arranged in the box shaped casing for the outside conductor (4), as indicated in step 620.

While there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:
1. A device for radio-frequency power coupling, comprising:
a box shaped casing forming an outside conductor;

at least one center conductor formed as a flat plate arranged parallel to a ground plane of the box shaped casing, and with isolating spacers in between;

connectors for inputting and outputting RF-power, said connectors being electrically connected to said at least one center conductor;

wherein the electrical connection between the connectors and the at least one center conductor is a direct electrical and mechanical connection.

2. The device according to claim 1, wherein the device includes at least one power combining or dividing part and at least one impedance transforming part.

3. The device according to claim 2, wherein the impedance transforming part is a narrow band or wideband frequency element.

4. The device according to claim 3, wherein the narrow band or wideband frequency element is an RF matching element for reducing RF power reflections.

5. The device according to claim 3, wherein the impedance transforming part is an electrical conduction line with one of an outer stepped, tapered or binomial shape.

6. The device according to claim 2, wherein the impedance transforming part is an electrical conduction line with one of an outer stepped, tapered or binomial shape.

7. The device according to claim 2, wherein the at least one power combining or dividing part and the at least one impedance transforming part are electrically and mechanically connected with each other directly or via an electrically conducting bridge.

8. The device according to claim 7, wherein the electrically conducting bridge comprises a bar.

9. The device according to claim 2, further comprising:

a recess for equalization of RF electrical length from output/input to input/output connectors within the power combining or dividing part.

10. The device according to claim 1, wherein the box shaped casing is a parallelepiped.

11. The device according to claim 10, wherein the parallelepiped is a cuboid.

12. The device according to claim 10, wherein the parallelepiped has substantially a dimension of a 19-inch rack having a module front panel wide of 482.6 mm.

13. The device according to claim 10, wherein the cuboid has substantially a dimension of a 19-inch rack having a module front panel wide of 482.6 mm.

14. The device according to claim 1, wherein at least one of (i) parts and (ii) all parts are made of solid metal pieces comprising at least one of (i) copper, (ii) aluminum and (iii) copper coated steel.

15. The device according to claim 1, further comprising:

at least one fluid cooling device to transfer heat from the device to the environment.

16. The device according to claim 15, wherein the fluid cooling device comprises a water cooling device.

17. The device according to claim 1, further comprising:

at least one of (i) at least one coaxial, (ii) a microstrip line, (iii) at least one rectangular waveguide and (iv) at least one circular waveguide connector.

18. The device according to claim 1, wherein the device comprises at least one of a power combiner and divider.

19. A method of utilizing a device for radio-frequency (RF) power coupling comprising a box shaped casing forming an outside conductor, at least one center conductor, connectors for inputting and outputting RF-power, said connectors being electrically connected to said at least one center conductor, the method comprising:

connecting the connectors for inputting and outputting the RF-power at least one of directly, electrically and mechanically to the at least one center conductor;

arranging the connectors in the box shaped casing for the outside conductor; and arranging a recess within the at least one center conductor to adjust an electrical length from output/input to input/output connectors such that RF equalization is attained within a power combining or dividing part of the device.

20. The method according to claim 19, wherein at least one of (i) a form, (ii) size and (iii) position of the recess is selected in accordance with a predefined electrical length from the output/input to input/output connectors.

21. The method according to claim 20, further comprising:

stacking box shaped devices at least one of (i) next to and (ii) on top of each other in 19-inch racks.

22. The method according to claim 19, further comprising:

stacking box shaped devices at least one of (i) next to and (ii) on top of each other in 19-inch racks.

* * * * *